(12) United States Patent
Tanaka et al.

(10) Patent No.: US 9,553,386 B2
(45) Date of Patent: Jan. 24, 2017

(54) CONTACT

(71) Applicant: FUJITSU COMPONENT LIMITED, Tokyo (JP)

(72) Inventors: Tetsugaku Tanaka, Tokyo (JP); Koki Sato, Tokyo (JP); Mitsuru Kobayashi, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 15/140,811

(22) Filed: Apr. 28, 2016

(65) Prior Publication Data

US 2016/0336674 A1     Nov. 17, 2016

(30) Foreign Application Priority Data

May 13, 2015    (JP) .................................. 2015-098114

(51) Int. Cl.
*H01R 13/24*     (2006.01)
*H01R 13/50*     (2006.01)
*G01R 1/067*     (2006.01)

(52) U.S. Cl.
CPC ....... *H01R 13/2457* (2013.01); *G01R 1/06722* (2013.01); *H01R 13/2421* (2013.01); *H01R 13/50* (2013.01)

(58) Field of Classification Search
CPC .... H01R 13/2421; H01R 33/46; H01R 23/722
USPC .......................................... 439/824, 700, 66
See application file for complete search history.

(56) References Cited

U.S. PATENT DOCUMENTS

| | | | | |
|---|---|---|---|---|
| 6,046,597 A | * | 4/2000 | Barabi ................. | G01R 1/0483 257/E23.078 |
| 6,491,527 B1 | * | 12/2002 | Smith ................ | H01R 13/2421 439/66 |
| 6,992,496 B2 | * | 1/2006 | Winter ................. | G01R 1/0441 324/750.25 |
| 7,233,156 B2 | * | 6/2007 | Yanagisawa ....... | G01R 1/06772 324/755.02 |
| 7,351,121 B2 | * | 4/2008 | Xu ..................... | H01R 13/2421 439/66 |
| 7,737,711 B2 | * | 6/2010 | Chang ................ | G01R 1/06722 324/754.12 |
| 7,845,955 B2 | * | 12/2010 | Nakayama ......... | G01R 1/07371 439/66 |

FOREIGN PATENT DOCUMENTS

JP       2007-024664       2/2007

* cited by examiner

Primary Examiner — Phuongchi T Nguyen
(74) Attorney, Agent, or Firm — IPUSA, PLLC

(57) ABSTRACT

A contact monolithically formed of a single metal plate includes a tubular part, a first end part, a second end part, and a spring accommodated in the tubular part. The first end part is at a first end of the tubular part and moves relative to the tubular part. The second end part includes a terminal and a flexible portion. The flexible portion extends from a second end of the tubular part. The terminal extends from the flexible portion in a direction away from the tubular part. The spring urges the first end part in a direction away from the second end part. The flexible portion deforms and thereby moves the terminal on a surface of an object when the terminal is pressed against the object.

5 Claims, 9 Drawing Sheets

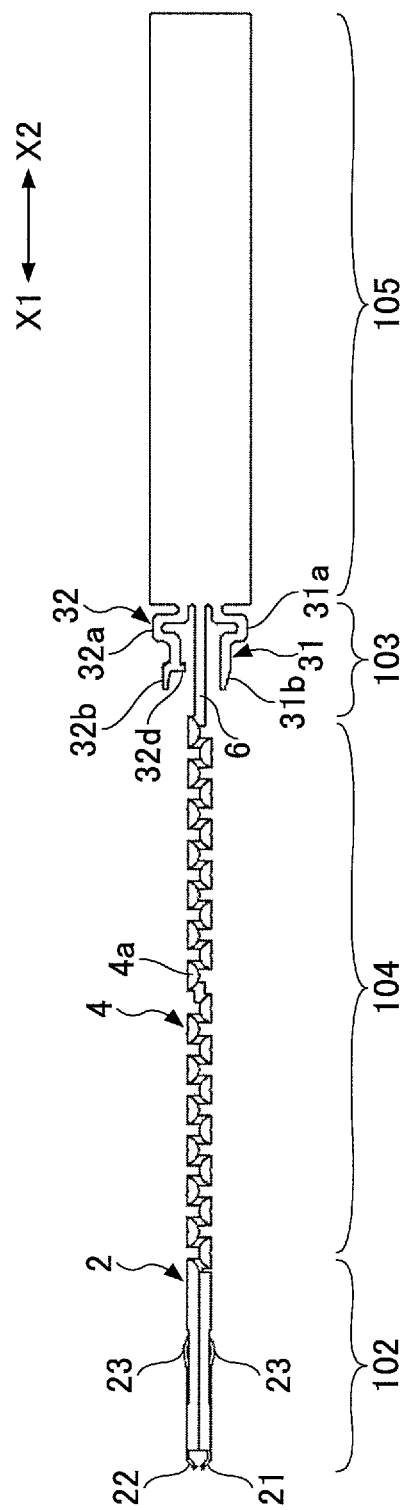

FIG.8A
FIG.8B
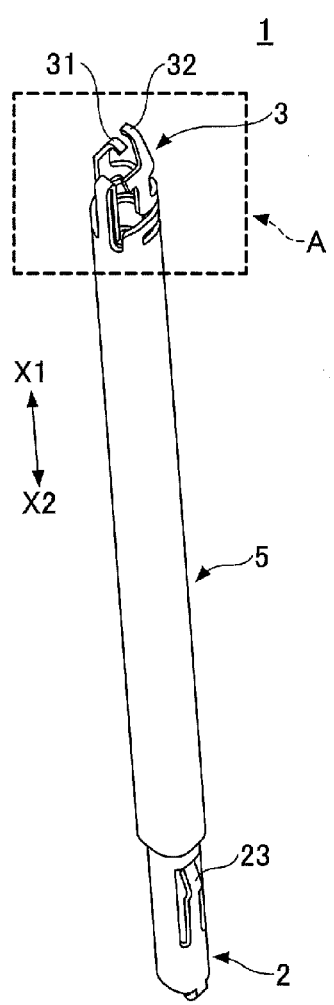
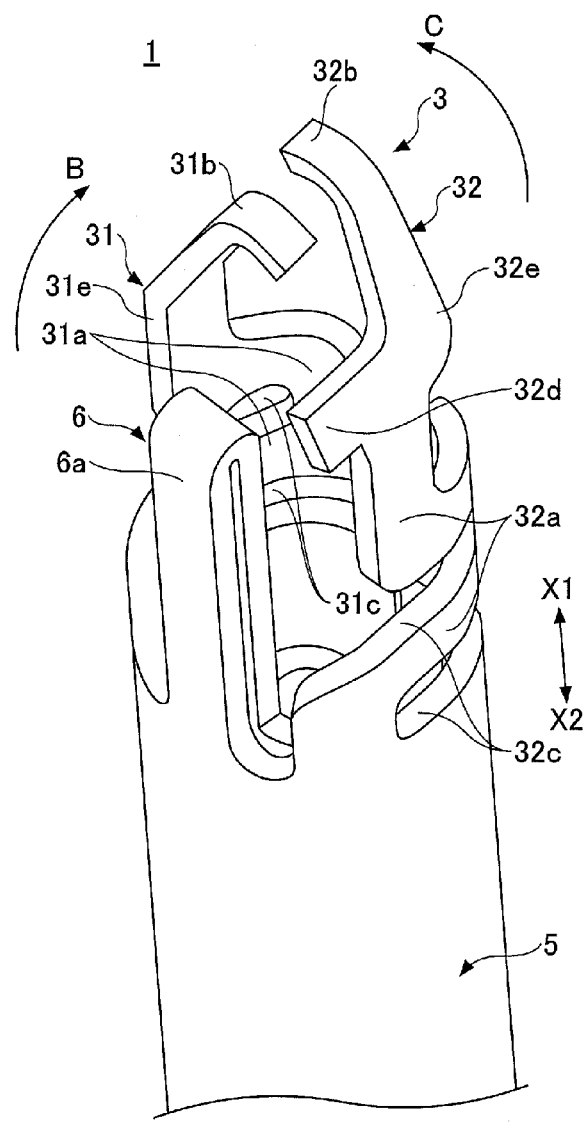

CONTACT

CROSS-REFERENCE TO RELATED APPLICATION

The present application is based upon and claims the benefit of priority of Japanese Patent Application No. 2015-098114, filed on May 13, 2015, the entire contents of which are incorporated herein by reference.

BACKGROUND OF THE INVENTION

1. Field of the Invention

The present invention relates to contacts.

2. Description of the Related Art

In the manufacture of semiconductor integrated circuits, a measurement apparatus that measures the electrical characteristics of semiconductor integrated circuits formed on a wafer may be employed. Such a measurement apparatus performs measurement by bringing contacts into contact with electrode pads or electrode terminals formed on the wafer.

Contacts used for the measurement apparatus include a contact referred to as "coil spring probe." The coil spring probe includes a coil spring housed in a tubular body, and a first end of the coil spring probe, which is a contact terminal provided at one end of the coil spring, comes into contact with an electrode pad or electrode terminal formed on a substrate such as a wafer. Furthermore, a second end of the coil spring probe electrically connects to the measurement apparatus. Furthermore, according to the coil spring probe, the coil spring provided in the tubular body allows the contact terminal to project and retract relative to the tubular body. (See, for example, Japanese Laid-Open Patent Application No. 2007-024664.)

SUMMARY OF THE INVENTION

According to an aspect of the present invention, a contact monolithically formed of a single metal plate includes a tubular part, a first end part, a second end part, and a spring accommodated in the tubular part. The first end part is at a first end of the tubular part and moves relative to the tubular part. The second end part includes a terminal and a flexible portion. The flexible portion extends from a second end of the tubular part. The terminal extends from the flexible portion in a direction away from the tubular part. The spring urges the first end part in a direction away from the second end part. The flexible portion deforms and thereby moves the terminal on a surface of an object when the terminal is pressed against the object.

BRIEF DESCRIPTION OF THE DRAWINGS

FIG. 5 is a bottom view of a metal plate, depicting a state where a first end part and a spring part of the contact according to the embodiment are formed;

FIG. 8A is a perspective view of the contact according to the embodiment;

FIG. 8B is an enlarged view of a second end part of the contact according to the embodiment;

DESCRIPTION OF THE EMBODIMENTS

Figure 1:
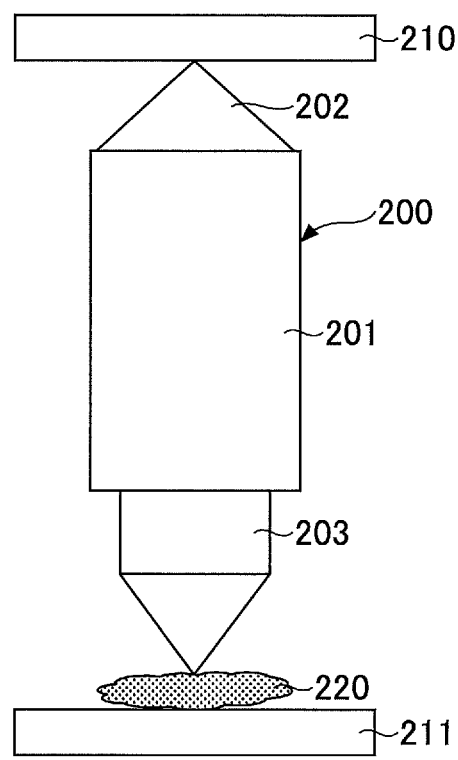
FIG. 1 is a diagram depicting a contact.

FIG. 1 is a schematic diagram depicting a coil spring probe 200. According to the coil spring probe 200, an upper contact terminal 202 at the top of a tubular part 201 comes into contact with an electrode terminal 210 of an upper substrate, and a lower contact terminal 203 projectable and retractable relative to the tubular part 201 comes into contact with an electrode terminal 211 of a lower substrate.

Here, if dust 220 is adhering to the electrode terminal 211, the lower contact terminal 203 may be prevented from coming into proper contact with the electrode terminal 211, thus resulting in poor electrical conduction.

According to an aspect of the present invention, a contact that increases the reliability of the contact between a contact terminal and an object with which the contact terminal comes into contact is provided.

Next, an embodiment according to the present invention is described with reference to accompanying drawings. The below-described embodiment is a non-limiting example and does not limit the invention. All the features and their combinations described in the following embodiment are not necessarily related to the essence of the invention.

In the following description and the accompanying drawings, the same or corresponding elements or parts are referred to using the same reference numeral, and descriptions thereof will not be repeated. Furthermore, the drawings do not aim at illustrating the relative size ratio between members or parts unless otherwise specified. Accordingly, specific dimensions of members or parts may be determined by a person having ordinary skill in the art in light of the following non-limiting embodiment.

Figure 2A:
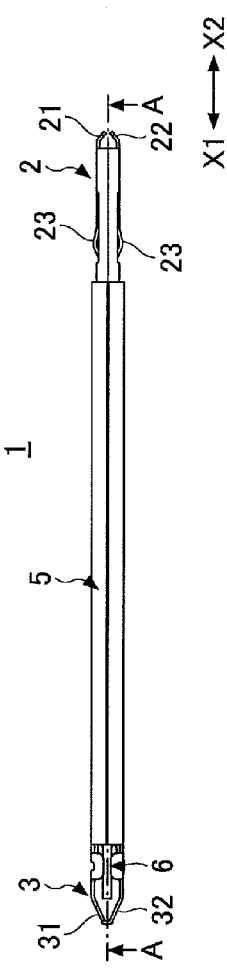
FIGS. 2A through 2E are a plan view, a side view, a front view, a rear view, and a bottom view, respectively, of a contact according to an embodiment.
Figure 2D:
Figure 2B:
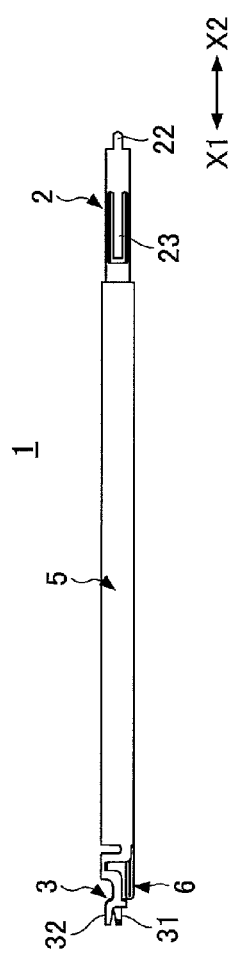
Figure 2E:
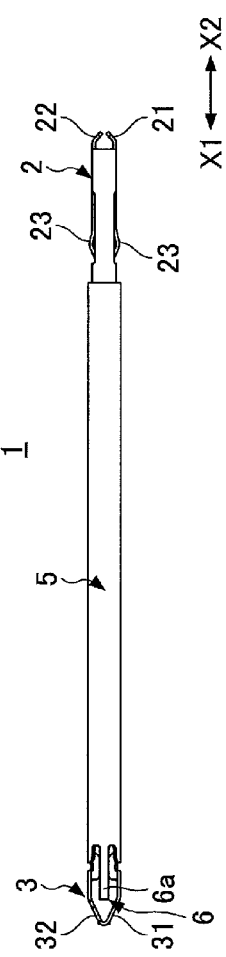
Figure 2C:
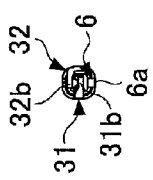
Figure 3:
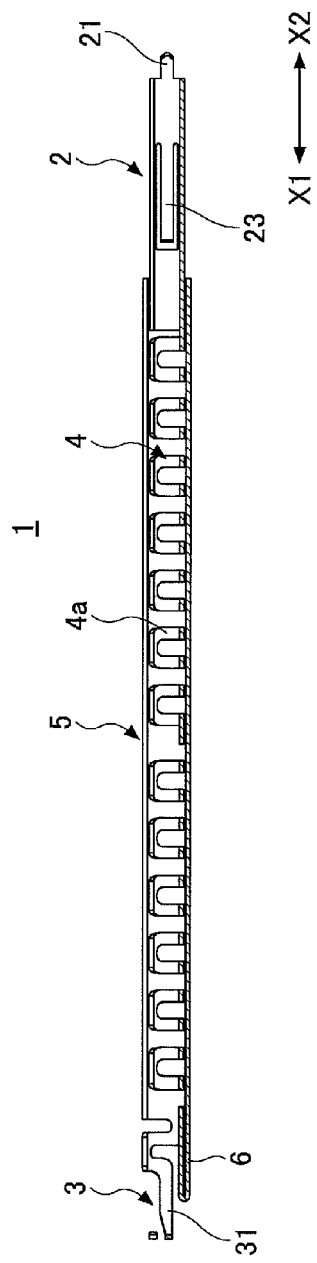
FIG. 3 is a cross-sectional view of the contact according to the embodiment, taken along a line A-A in FIG. 2A.

FIGS. 2A through 2E and 3 are diagrams illustrating a contact 1 according to an embodiment. FIG. 2A is a plan view of the contact 1. FIG. 2B is a side view of the contact 1. FIGS. 2C and 2D are a front view and a rear view, respectively, of the contact 1. FIG. 2E is a bottom view of the contact 1. FIG. 3 is a cross-sectional view of the contact 1, taken along a line A-A in FIG. 1A.

For example, the contact 1 is used to test electronic components or electrical circuits. The contact 1 electrically connects a test apparatus and an electrode pad or an electrode terminal of a ball grid array (BGA) formed on an electronic component or electrical circuit.

The contact 1 includes a first end part 2, a second end part 3, a spring part 4, a tubular part 5, and a connecting part 6. As described below, the first end part 2, the second end part 3, the spring part 4, the tubular part 5, and the connection part 6 are monolithically formed of a single metal plate. In the drawing, lengthwise (longitudinal) directions of the contact 1 are indicated by arrows X1 and X2, and may be referred to as the X1 direction and the X2 direction, respectively. Furthermore, an end of a member or part facing in the X1 direction may be referred to as "X1 end" and an end of a member or part facing in the X2 direction may be referred to as "X2 end."

The first end part 2 is positioned at a first longitudinal end (X2 end) of the tubular part 5. The first end part 2 has a cylindrical shape. The X2 end of the first end part 2 is formed into a first first-end contact 21 and a second first-end contact 22. A pair of lugs (cut and raised parts) 23 is formed in a cylindrical body of the first end part 2. The lugs 23 are on opposite sides of the cylindrical body and project outward relative to a circumferential surface of the cylindrical body.

The first first-end contact 21 is opposite to the second first-end contact 22 as depicted in FIGS. 2A and 2E. Furthermore, the first and second first-end contacts 21 and 22 are bent inward toward each other.

The second end part 3 is monolithically formed with the tubular part 5 at its second longitudinal end (X1 end). The second end part 3 includes a first second-end contact 31 and a second second-end contact 32 that is opposite to the first second-end contact 31.

The spring part 4 is positioned in the tubular part 5. As depicted in FIG. 3, the connecting part 6 extends and is folded 180° between the X1 end of the spring part 4 and the X1 end of the tubular part 5. The first end part 2 extends from the X2 end of the spring part 4. Thus, the first end part 2, the spring part 4, the connection part 6, the tubular part 5, and the second end part 3 form a monolithic structure. That is, the contact 1 has a monolithic structure.

The spring part 4 includes a meandering portion 4a. Both longitudinal sides of the meandering portion 4a are bent along the length of the meandering portion 4a to face each other, so that the spring part 4 is compact enough to be housed in the tubular part 5.

The second end part 3 extends directly from the X1 end of the tubular part 5. Meanwhile, the first end part 2 extends directly from the X2 end of the spring part 4 attached to the interior of the tubular part 5. Accordingly, when the spring part 4 elastically deforms, the first end part 2 moves relative to the second end part 3 and the tubular part 5 in a lengthwise direction (the X1 or X2 direction) of the contact 1 in accordance with the elastic deformation of the spring part 4. The spring part 4 urges the first end part 2 in a direction away from the second end part 3 (that is, in the X2 direction).

Next, the manufacture of the contact 1 is described.

Figure 4:
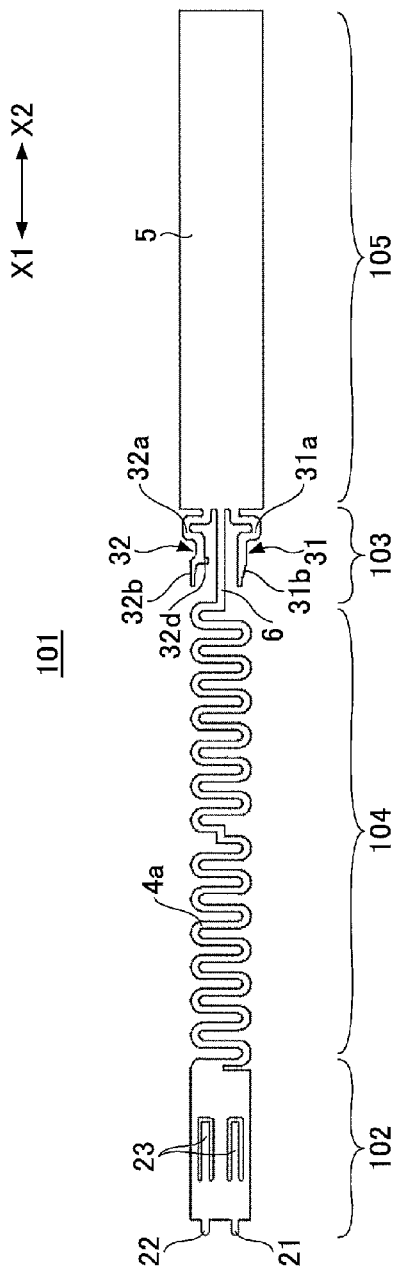
FIG. 4 is a developed view of the contact according to the embodiment.
Figure 6A:
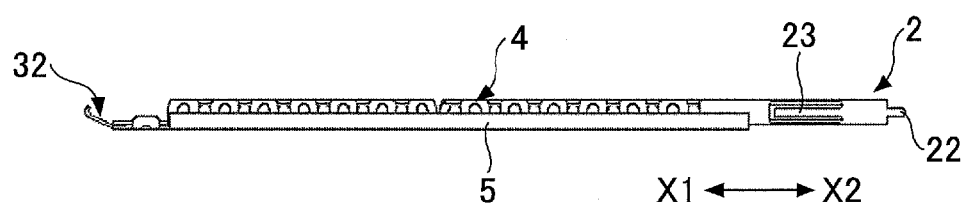
FIGS. 6A and 6B are a side view and a bottom view, respectively, of the metal plate, depicting a state where a connection part of the contact according to the embodiment is folded.
Figure 6B:
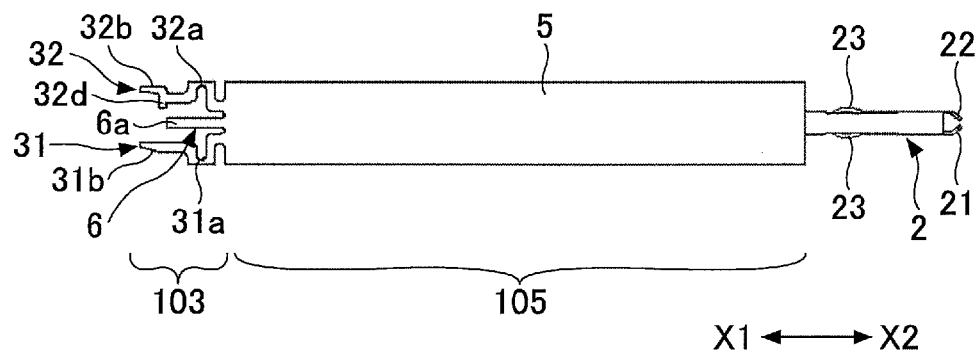

FIGS. 4 through 6B are diagrams depicting a process for manufacturing the contact 1. FIG. 4 is a bottom view of a metal plate 101, which corresponds to a developed view of the contact 1. FIG. 5 is a bottom view of the metal plate 101, depicting a state where the first end part 2 and the spring part 4 are formed. FIGS. 6A and 6B are a side view and a bottom view, respectively, of the metal plate 101, depicting a state where the connection part 6 is folded.

First, the metal plate 101 depicted in FIG. 4 is formed by performing press working or etching on a metal plate formed of copper or a copper alloy.

The metal plate 101 has a monolithic structure of a contact section 102 corresponding to the first end part 2, a spring section 104 corresponding to the spring part 4, a terminal section 103 corresponding to the second end part 3 and the connecting part 6, and a tube section 105 corresponding to the tubular part 5.

When the metal plate 101 is formed, the first and second first-end contacts 21 and 22 and the lugs 23 are formed in the contact section 102. The meandering portion 4a having a serpentine shape is formed in the spring section 104. The first and second second-end contacts 31 and 32 and the connecting part 6 that connects the spring section 104 and the tube section 105 are formed in the terminal section 103. The tube section 105 is formed into a rectangular plate shape.

The metal plate 101 is subjected to plating. The metal plate 101 may be plated with, for example, Ni, Pd and Au in this order or Ni and Au in this order. Plating materials are not limited to those described above.

Next, as depicted in FIG. 5, the contact section 102 is bent into a cylindrical shape elongated in the X1 and X2 directions, and the first and second first-end contacts 21 and 22 are bent inward toward each other, so that the first end part 2 is formed. Furthermore, both longitudinal sides of the meandering portion 4a of the spring section 104 are bent substantially at right angles to face each other, so that the spring part 4 is formed.

Next, as depicted in FIGS. 6A and 6B, the connecting part 6 is folded 180° so that the spring part 4 lies on top of the tube section 105. By folding the connecting part 6 180°, the first end part 2 and the terminal section 103 are positioned at opposite longitudinal ends of the tube section 105.

Next, the tube section 105 is bent to enclose the spring part 4, so that the tubular part 5 is formed to accommodate the spring part 4 inside.

Furthermore, part of the first end part 2 is in the tubular part 5, and the first end part 2 is slidable relative to the tubular part 5. Furthermore, when the first end part 2 slides relative to the tubular part 5, the spring part 4 elastically deforms in a lengthwise direction (the X1 or X2 direction) of the contact 1.

Next, the first and second second-end contacts 31 and 32 of the terminal section 103 are shaped.

Figure 7:
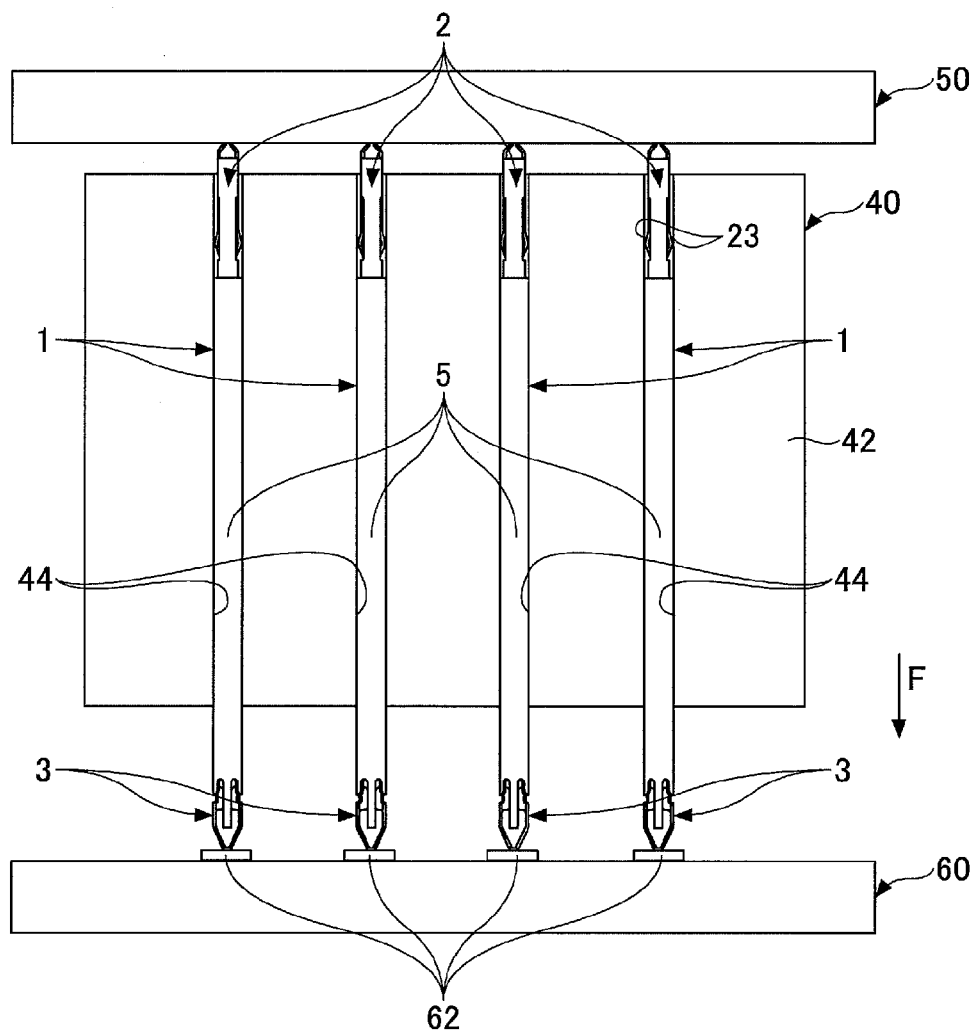
FIG. 7 is a diagram depicting a connector that accommodates contacts in holes formed in a housing according to the embodiment.

FIG. 7 is a diagram depicting a form of use of the contact 1. FIG. 7 depicts a case where the contact 1 is applied to a connector 40 that electrically connects an upper substrate 50 and a lower substrate 60. The connector 40 is used for, for example, memory testing, liquid crystal panel inspection, and substrate inspection, in which the contact 1 is substituted for a contact pin that is also referred to as a "pogo pin."

Referring to FIG. 7, the connector 40 includes multiple contacts 1 and a housing 42 in which multiple holes 44 are formed. The housing 42 is formed of an insulating material. The contacts 1 are provided one in each hole 44 to be attached to the housing 42 in the holes 44. When the contacts 1 are attached to the housing 42, the lugs 23 formed in the first end part 2 of each contact 1 are in pressure contact with an interior surface of the housing 42 that defines the corresponding hole 44.

When the upper substrate 50 and the lower substrate 60 are connected by the connector 40, the first end part 2 of each contact 1 is in pressure contact with an electrode pad of the upper substrate 50, and the second end part 3 of each contact 1 is in pressure contact with one of electrode pads 62 of the lower substrate 60.

Next, the second end part 3 of the contact 1 is described.

FIG. 8A is a perspective view of the contact 1 with the second end part 3 facing upward, and FIG. 8B is an enlarged view of part of the contact 1 in a broken-line box indicated by arrow A in FIG. 8A.

Referring to FIGS. 8A and 8B, the first second-end contact 31 includes a flexible portion 31a, a contact portion 31b, and an intermediate portion 31e, and the second second-end contact 32 includes a flexible portion 32a, a contact portion 32b, a lock portion 32d, and an intermediate portion 32e. The contact portion 31b and the intermediate portion 31e may be referred to a first terminal, and the contact portion 32b and the intermediate portion 32e may be referred to a second terminal.

While the two second-end contacts 31 and 32 are provided according to this embodiment, the number of second-end contacts may be one or more than two. By increasing the number of second-end contacts, it is possible to increase the reliability of the electrical connection between the contact 1 and the corresponding electrode pad 62 because even when a connection failure occurs between one second-end contact and the electrode pad 62, other second-end contacts remain in contact with the electrode pad 62.

The flexible portions 31a and 32a extend from the X1 end of the tubular part 5. Each of the flexible portions 31a and 32a has a meandering shape when the contact 1 is developed as depicted in FIG. 4. Furthermore, the flexible portions 31a and 32a are cylindrically shaped at the same time that the tubular part 5 is formed into a cylindrical shape. Slits 31c and 32c are formed in the cylindrically shaped flexible portions 31a and 32a, respectively.

The flexible portion 31a and the contact portion 31b are at opposite ends of the first second-end contact 31 with the intermediate portion 31e extending between the flexible portion 31a and the contact portion 31b. The flexible portion 32a and the contact portion 32b are at opposite ends of the second second-end contact 32 with the intermediate portion 32e extending between the flexible portion 32a and the contact portion 32b. The intermediate portions 31e and 32e are bent inward to bring the contact portions 31b and 32b close to each other.

The contact portions 31b and 32b are curved to facilitate their movements on the corresponding electrode pad 62.

As depicted in FIGS. 2C, 8A, 8B and 10, the contact portions 31b and 32b are at positions offset from each other to allow the first and second second-end contacts 31 and 32 to cross each other when deforming. For example, when viewed in the X2 direction as depicted in FIG. 2C, the contact portions 31b and 32b are offset from each other so that the contact portion 32b is positioned across the contact portion 31b from the connecting part 6. In other words, the contact portions 31b and 32b are offset from each other in a direction perpendicular to a plane parallel to an exterior flat surface 6a of the connecting part 6 that is on the bottom side of the contact 1.

The lock portion 32d extends from the intermediate portion 32e of the second second-end contact 32 to project in a direction in which the first second-end contact 31 is offset from the second second-end contact 32. The lock portion 32d faces the first second-end contact 31.

Figure 9A:
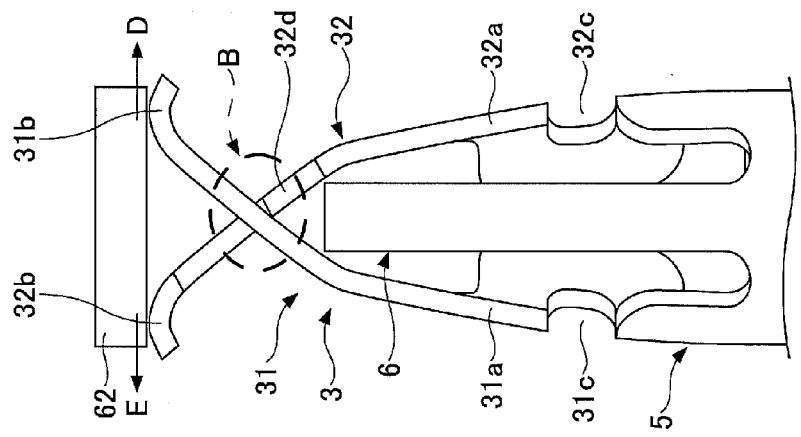
FIGS. 9A through 9C are diagrams for describing a wiping operation of the second end part according to the embodiment.
Figure 9B:
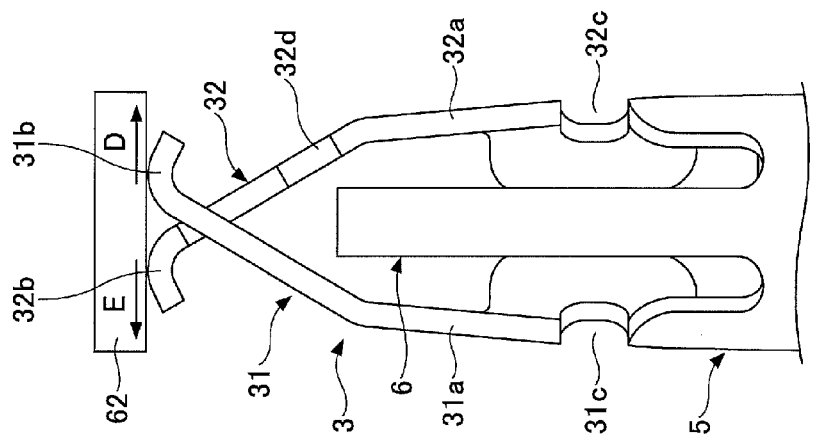
Figure 9C:
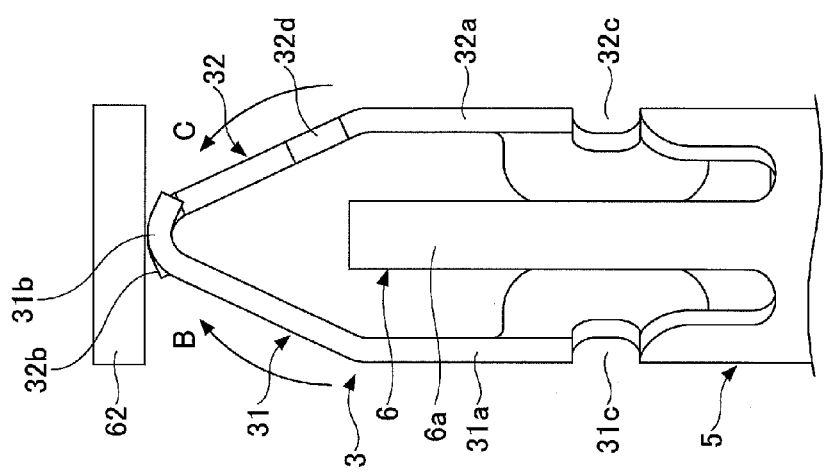

Next, movements of the second end part 3 at the time when the contact 1 is pressed by the corresponding electrode pad 62 are described with reference to FIGS. 9A through 9C. FIGS. 9A through 9C are enlarged views of the second end part 3 and the electrode pad 62 that are in contact with each other, taken from the bottom side of the contact 1.

FIG. 9A depicts the state immediately after the second end part 3 comes into contact with the electrode pad 62. In the state of FIG. 9A, substantially no pressing force is applied to the first and second second-end contacts 31 and 32. Hereinafter, the state of FIG. 9A is referred to as "pre-pressing state." In the pre-pressing state, the contact portions 31b and 32b are positioned side by side to be adjacent to each other in a direction perpendicular to a plane parallel to the exterior flat surface 6a of the connecting part 6.

Because the slits 31c and 32c are formed, the flexible portions 31a and 32a are more likely to deform than other portions of the second end part 3. Accordingly, when the contact 1 in the state of FIG. 9A is pressed toward the electrode pad 62, the first second-end contact 31 deforms inward (in a direction indicated by arrow B ("B direction") in FIGS. 8B and 9A) relative to the tubular part 5, and the second second-end contact 32 deforms inward (in a direction indicated by arrow C ("C direction") in FIGS. 8B and 9A) relative to the tubular part 5.

When the contact 1 is further pressed toward the electrode pad 62, the first second-end contact 31 further deforms in the B direction, so that the contact portion 31b in contact with the electrode pad 62 moves on a surface of the electrode pad 62 in a direction indicated by arrow D ("D direction") as depicted in FIG. 9B. Furthermore, the second second-end contact 32 further deforms in the C direction, so that the contact portion 32b in contact with the electrode pad 62 moves on a surface of the electrode pad 62 in a direction indicated by arrow E ("E direction") as depicted in FIG. 9B.

Thus, the contact portions 31b and 32b in pressure contact with the electrode pad 62 move on the surface of the electrode pad 62 in the D and E directions, respectively. Therefore, dust adhering to the surface of the electrode pad 62 is removed by the contact portions 31b and 32b. Accordingly, it is possible to prevent the occurrence of a connection failure between the contact 1 and the electrode pad 62 due to dust adhering to the electrode pad 62, and it is thereby possible to increase the reliability of the connection of the contact 1 and the electrode pad 62.

Furthermore, according to this embodiment, the contact portions 31b and 32b are, in a plane tangent to the contact portions 31b and 32b, at positions offset from each other in a direction perpendicular to the D and E directions in which the contact portions 31b and 32b are designed to move, so that the first and second second-end contacts 31 and 32 cross each other as depicted in FIG. 9B when the contact portions 31b and 32b move on the surface of the electrode pad 62.

Therefore, the contact portions 31b and 32b are prevented from interfering with each other, and are allowed to move on the surface of the electrode pad 62, thus ensuring the wiping effect, that is, removal of dust adhering to the surface of the electrode pad 62.

If the contact portion 31b excessively moves in the D direction and the contact portion 32b excessively moves in the E direction, however, the interval between the contact portions 31b and 32b excessively increases, so that the contact portion 31b and 32b may come out of contact with the electrode pad 62 to cause a contact failure between the contact 1 and the electrode pad 62.

Figure 10:
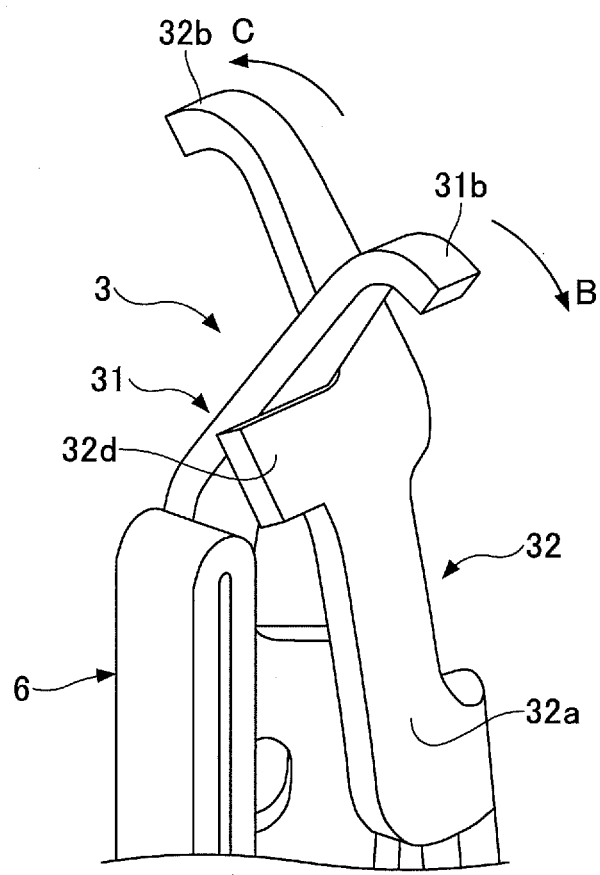
FIG. 10 is a diagram for describing an operation of a lock portion of the second end part according to the embodiment.

According to this embodiment, the second second-end contact 32 includes the lock portion 32d that faces the first second-end contact 31, and when the contact portions 31b and 32b move to opposite ends of the electrode pad 62, the first second-end contact 31 comes into contact with the lock portion 32d as depicted in FIG. 9C. As a result, as depicted in FIG. 10, the first and second second-end contacts 31 and 32 are prevented from further deforming in the B and C directions, respectively, so that the contact portions 31b and 32b are prevented from moving beyond the ends of the electrode pad 62. Thus, by providing the lock portion 32d, it is possible to prevent the contact portions 31b and 32b from coming out of contact with the electrode pad 62, and it is thereby possible to increase the reliability of the connection of the contact 1 and the electrode pad 62.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A contact monolithically formed of a single metal plate, comprising:
   a tubular part;
   a first end part configured to move relative to the tubular part at a first end thereof;
   a second end part including a terminal and a flexible portion, the flexible portion extending from a second end of the tubular part, and the terminal extending from the flexible portion in a direction away from the tubular part; and
   a spring, accommodated in the tubular part, that urges the first end part in a direction away from the second end part,
   wherein the flexible portion is configured to deform and thereby move the terminal on a surface of an object when the terminal is pressed against the object.

2. The contact as claimed in claim 1, further comprising:
   a lock portion configured to come into contact with the terminal and prevent the terminal from moving beyond an end of the surface of the object when the terminal is pressed against the object.

3. The contact as claimed in claim 1, wherein
   the second end part further includes an additional terminal and an additional flexible portion, the additional flexible portion extending from the second end of the tubular part, and the additional terminal extending from the additional flexible portion in a direction away from the tubular part, and
   the additional flexible portion is configured to deform and thereby move the additional terminal on the surface of the object when the additional terminal is pressed against the object.

4. The contact as claimed in claim 3, wherein the terminal and the additional terminal are positioned to cross each other when the terminal and the additional terminal are pressed against the object.

5. The contact as claimed in claim 3, wherein
   the terminal and the additional terminal include respective contact portions that come into contact with the surface of the object and move on the surface of the object in opposite directions when the terminal and the additional terminal are pressed against the object, and
   the contact portions are offset from each other in a direction perpendicular to the opposite directions in a plane tangent to the contact portions.

* * * * *